United States Patent
Gilbrech

(10) Patent No.: US 10,472,894 B2
(45) Date of Patent: Nov. 12, 2019

(54) RESONANT TRANSFORMER FOR DOWNHOLE ELECTROCRUSHING DRILLING

(71) Applicants: Halliburton Energy Services, Inc., Houston, TX (US); Chevron U.S.A. Inc., San Ramon, CA (US); SDG LLC, Minden, NV (US)

(72) Inventor: Joshua A. Gilbrech, Albuquerque, NM (US)

(73) Assignees: Halliburton Energy Services, Inc., Houston, TX (US); Chevron U.S.A. Inc., San Ramon, CA (US); SDG LLC, Minden, NV (US)

( * ) Notice: Subject to any disclaimer, the term of this patent is extended or adjusted under 35 U.S.C. 154(b) by 184 days.

(21) Appl. No.: 15/544,408

(22) PCT Filed: Oct. 13, 2016

(86) PCT No.: PCT/US2016/056778
§ 371 (c)(1),
(2) Date: Jul. 18, 2017

(87) PCT Pub. No.: WO2018/071020
PCT Pub. Date: Apr. 19, 2018

(65) Prior Publication Data
US 2018/0209216 A1 Jul. 26, 2018

(51) Int. Cl.
*E21B 7/15* (2006.01)
*E21B 41/00* (2006.01)
(Continued)

(52) U.S. Cl.
CPC ............ *E21B 7/15* (2013.01); *E21B 10/00* (2013.01); *E21B 41/0085* (2013.01); *H03K 3/02* (2013.01)

(58) Field of Classification Search
CPC .............................. E21B 41/0085; E21B 7/15
See application file for complete search history.

(56) References Cited

U.S. PATENT DOCUMENTS

| 4,343,356 A * | 8/1982 | Riggs ........................ E21B 36/04 |
| | | 166/248 |
| 2001/0022540 A1 * | 9/2001 | Hill ............................ H03C 3/16 |
| | | 332/102 |

(Continued)

FOREIGN PATENT DOCUMENTS

| EP | 2554779 | 2/2013 |
| WO | 2013-070609 | 5/2013 |
| WO | 2015/124733 | 8/2015 |

OTHER PUBLICATIONS

International Search Report and Written Opinion for PCT Patent Application No. PCT/US2014/056778, dated May 1, 2017; 16 pages.

(Continued)

*Primary Examiner* — Shane Bomar
(74) *Attorney, Agent, or Firm* — Baker Botts L.L.P.

(57) ABSTRACT

A downhole drilling system is disclosed. The downhole drilling system may include a pulse-generating circuit electrically coupled to a power source to provide power at a frequency, the pulse-generating circuit comprising an input stage tank circuit electrically coupled to the power source, the input stage tank circuit configured to have a resonant frequency approximately equal to the frequency; a series tank circuit electromagnetically coupled to the input stage tank circuit, the series tank circuit configured to have a resonant frequency approximately equal to the frequency; and an output stage tank circuit electromagnetically coupled to the series tank circuit, the output stage tank circuit configured to have a resonant frequency approximately equal to the frequency; and a drill bit including a first (Continued)

electrode and a second electrode electrically coupled to the output stage tank circuit to receive an electric pulse from the pulse-generating circuit.

22 Claims, 8 Drawing Sheets

(51) Int. Cl.
*E21B 10/00* (2006.01)
*H03K 3/02* (2006.01)

(56) References Cited

U.S. PATENT DOCUMENTS

| | | | |
|---|---|---|---|
| 2003/0001456 A1 | 1/2003 | Kauf et al. | |
| 2012/0168177 A1* | 7/2012 | Moeny | E21B 7/15 166/380 |
| 2012/0235829 A1* | 9/2012 | Adnan | E21B 41/00 340/854.9 |
| 2013/0071286 A1* | 3/2013 | Watson | A61M 16/12 422/22 |
| 2013/0140086 A1 | 6/2013 | Moeny | |
| 2014/0008073 A1* | 1/2014 | Rey-Bethbeder | E21B 36/04 166/308.1 |
| 2014/0008968 A1* | 1/2014 | Moeny | E21B 7/15 307/2 |
| 2015/0083401 A1 | 3/2015 | Saad | |
| 2017/0067292 A1 | 3/2017 | Bayol et al. | |
| 2017/0350197 A1* | 12/2017 | Sugiura | E21B 47/12 |
| 2018/0053973 A1* | 2/2018 | Tong | G01R 33/3456 |

OTHER PUBLICATIONS

O'Loughlin, J.P.; Sidler, J.D.; Rohwein, G.J., "Air core pulse transformer design," in Power Modulator Symposium, 1988. IEEE Conference Record of the 1988 Eighteenth , vol., No., pp. 325-330, Jun. 20-22, 1988; 6 pages.

Uglum, J.R. "Theory of the Resonant Transformer Accelerator and some Design Considerations." Energy Sciences Inc., Aug. 1973; 42 pages.

Lawson, R.N.; Rohwein, G.J., "A study of compact, lightweight, high voltage inductors with partial magnetic cores," in Pulsed Power Conference, 1989. 7th , vol., No., pp. 906-908, 1989 doi: 10.1109/PPC.1989.767636; 3 pages.

Rohwein, G. J., et al. "An scr-switched, high voltage, high gain linear transformer system." Pulsed Power Conference, 1989. 7th. IEEE, 1989.; 4 pages.

Adler, R. J., and V. M. Weeks. "Design and operation of a 700 kV arbitrary waveform generator." Pulsed Power Conference, 2009. PPC'09. IEEE. IEEE, 2009; 4 pages.

Lim, Soo Won, et al. "Fabrication and operation testing of a dual resonance pulse transformer for PFL pulse charging." Journal of the Korean Physical Society 59.61 (2011): 3679-3682; 4 pages.

Lawson, R. N., and G. J. Rohwein. "Partial core pulse transformer." No. Patents-US--A7764253. Sandia National Labs., Albuquerque, NM (United States), 1991; 16 pages.

* cited by examiner

RESONANT TRANSFORMER FOR DOWNHOLE ELECTROCRUSHING DRILLING

RELATED APPLICATIONS

This application is a U.S. National Stage Application of International Application No. PCT/US2016/056778 filed Oct. 13, 2016, which designates the United States, and which is incorporated herein by reference in its entirety.

TECHNICAL FIELD

The present disclosure relates generally to downhole electrocrushing drilling and, more particularly, to resonant transformers for downhole electrocrushing drilling.

BACKGROUND

Electrocrushing drilling uses pulsed power technology to drill a wellbore in a rock formation. Pulsed power technology repeatedly applies a high electric potential across the electrodes of an electrocrushing drill bit, which ultimately causes the surrounding rock to fracture. The fractured rock is carried away from the bit by drilling fluid and the bit advances downhole.

BRIEF DESCRIPTION OF THE DRAWINGS

For a more complete understanding of the present disclosure and its features and advantages, reference is now made to the following description, taken in conjunction with the accompanying drawings, in which.

DETAILED DESCRIPTION

Electrocrushing drilling may be used to form wellbores in subterranean rock formations for recovering hydrocarbons, such as oil and gas, from these formations. Electrocrushing drilling uses pulsed-power technology to repeatedly fracture the rock formation by repeatedly delivering high-energy electrical pulses to the rock formation. In some applications, certain components of a pulsed-power system may be located downhole. For example, a pulse-generating circuit may be located in a bottom-hole assembly (BHA) near the electrocrushing drill bit. The pulse-generating circuit may include one or more resonant circuits that form a resonant transformer. For example, the pulse-generating circuit may include one or more parallel and series tank circuits resonating at a resonant frequency. Such tank circuits convert energy from a low-voltage source into high-voltage electric pulses for powering electrodes of an electrocrushing drill bit. In addition, the pulse-generating circuit may be designed to withstand the harsh environment of a downhole pulsed-power system. For example, the pulse-generating circuit may operate over a wide temperature range (for example, from approximately 10 to approximately 200 degrees Centigrade), and may physically withstand the vibration and mechanical shock resulting from the fracturing of rock during downhole electrocrushing drilling.

There are numerous ways in which a pulse-generating circuit may be implemented in a downhole electrocrushing pulsed-power system. Thus, embodiments of the present disclosure and its advantages are best understood by referring to FIGS. 1 through 7, where like numbers are used to indicate like and corresponding parts.

Figure 1:
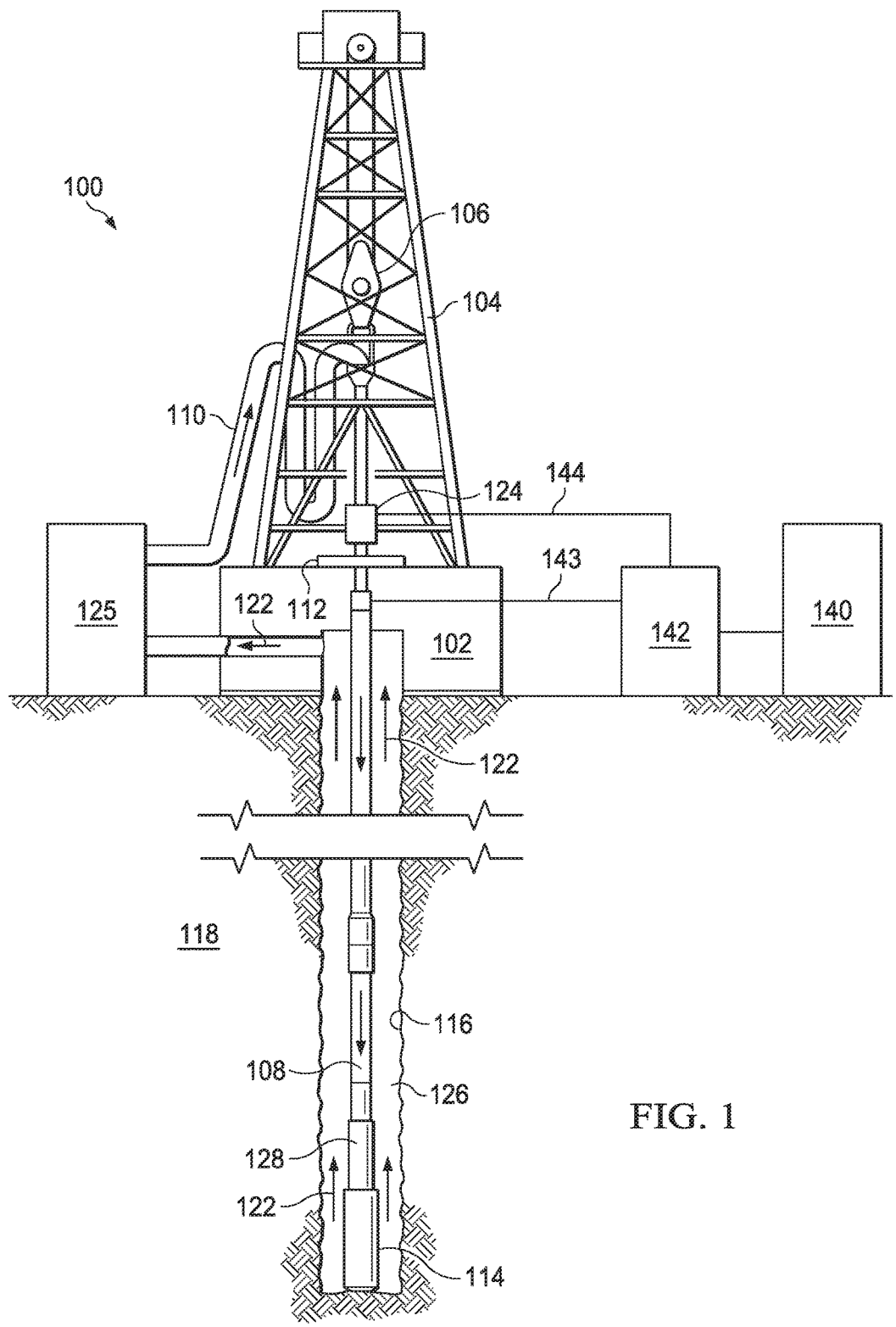
FIG. 1 is an elevation view of an exemplary downhole electrocrushing drilling system used in a wellbore environment.

FIG. 1 is an elevation view of an exemplary electrocrushing drilling system used to form a wellbore in a subterranean formation. Although FIG. 1 shows land-based equipment, downhole tools incorporating teachings of the present disclosure may be satisfactorily used with equipment located on offshore platforms, drill ships, semi-submersibles, and drilling barges (not expressly shown). Additionally, while wellbore 116 is shown as being a generally vertical wellbore, wellbore 116 may be any orientation including generally horizontal, multilateral, or directional.

Drilling system 100 includes drilling platform 102 that supports derrick 104 having traveling block 106 for raising and lowering drill string 108. Drilling system 100 also includes pump 125, which circulates electrocrushing drilling fluid 122 through a feed pipe to kelly 110, which in turn conveys electrocrushing drilling fluid 122 downhole through interior channels of drill string 108 and through one or more orifices in electrocrushing drill bit 114. Electrocrushing drilling fluid 122 then circulates back to the surface via annulus 126 formed between drill string 108 and the sidewalls of wellbore 116. Fractured portions of the formation are carried to the surface by electrocrushing drilling fluid 122 to remove those fractured portions from wellbore 116.

Electrocrushing drill bit 114 is attached to the distal end of drill string 108. Power to electrocrushing drill bit 114 may be supplied from the surface. For example, generator 140 may generate electrical power and provide that power to power-conditioning unit 142. Power-conditioning unit 142 may then transmit electrical energy downhole via surface cable 143 and a sub-surface cable (not expressly shown in FIG. 1) contained within drill string 108 or attached to the side of drill string 108. A pulse-generating circuit within BHA 128 may receive the electrical energy from power-conditioning unit 142, and may generate high-energy pulses to drive electrocrushing drill bit 114. The pulse-generating circuit may include a resonant transformer with one or more parallel and series tank circuits tuned to operate at a resonant frequency as described in further detail below with reference to FIGS. 3-6.

The pulse-generating circuit within BHA 128 may be utilized to repeatedly apply a high electric potential, for example up to or exceeding 150 kV, across the electrodes of electrocrushing drill bit 114. Each application of electric potential is referred to as a pulse. When the electric potential across the electrodes of electrocrushing drill bit 114 is increased enough during a pulse to generate a sufficiently high electric field, an electrical arc forms through a rock formation at the bottom of wellbore 116. The arc temporarily forms an electrical coupling between the electrodes of electrocrushing drill bit 114, allowing electric current to flow through the arc inside a portion of the rock formation at the bottom of wellbore 116. The arc greatly increases the temperature and pressure of the portion of the rock formation through which the arc flows and the surrounding formation and materials. The temperature and pressure is sufficiently high to break the rock itself into small bits or cuttings. This fractured rock is removed, typically by electrocrushing drilling fluid 122, which moves the fractured rock away from the electrodes and uphole. The terms "uphole" and "downhole" may be used to describe the location of various components of drilling system 100 relative to the bottom or end of wellbore 116 shown in FIG. 1. For example, a first component described as uphole from a second component may be further away from the end of wellbore 116 than the second component. Similarly, a first component described as being downhole from a second component may be located closer to the end of wellbore 116 than the second component.

As electrocrushing drill bit 114 repeatedly fractures the rock formation and electrocrushing drilling fluid 122 moves the fractured rock uphole, wellbore 116, which penetrates various subterranean rock formations 118, is created. Wellbore 116 may be any hole drilled into a subterranean formation or series of subterranean formations for the purpose of exploration or extraction of natural resources such as, for example, hydrocarbons, or for the purpose of injection of fluids such as, for example, water, wastewater, brine, or water mixed with other fluids. Additionally, wellbore 116 may be any hole drilled into a subterranean formation or series of subterranean formations for the purpose of geothermal power generation.

Although drilling system 100 is described herein as utilizing electrocrushing drill bit 114, drilling system 100 may also utilize an electrohydraulic drill bit. An electrohydraulic drill bit may have one or more electrodes and electrode spacing configurations similar to electrocrushing drill bit 114. But, rather than generating an arc within the rock, an electrohydraulic drill bit applies a large electrical potential across the one or more electrodes and the ground ring to form an arc across the drilling fluid proximate the bottom of wellbore 116. The high temperature of the arc vaporizes the portion of the fluid immediately surrounding the arc, which in turn generates a high-energy shock wave in the remaining fluid. The one or more electrodes of electrohydraulic drill bit may be oriented such that the shock wave generated by the arc is transmitted toward the bottom of wellbore 116. When the shock wave hits and bounces off of the rock at the bottom of wellbore 116, the rock fractures. Accordingly, drilling system 100 may utilize pulsed-power technology with an electrohydraulic drill bit to drill wellbore 116 in subterranean formation 118 in a similar manner as with electrocrushing drill bit 114.

Figure 2A:
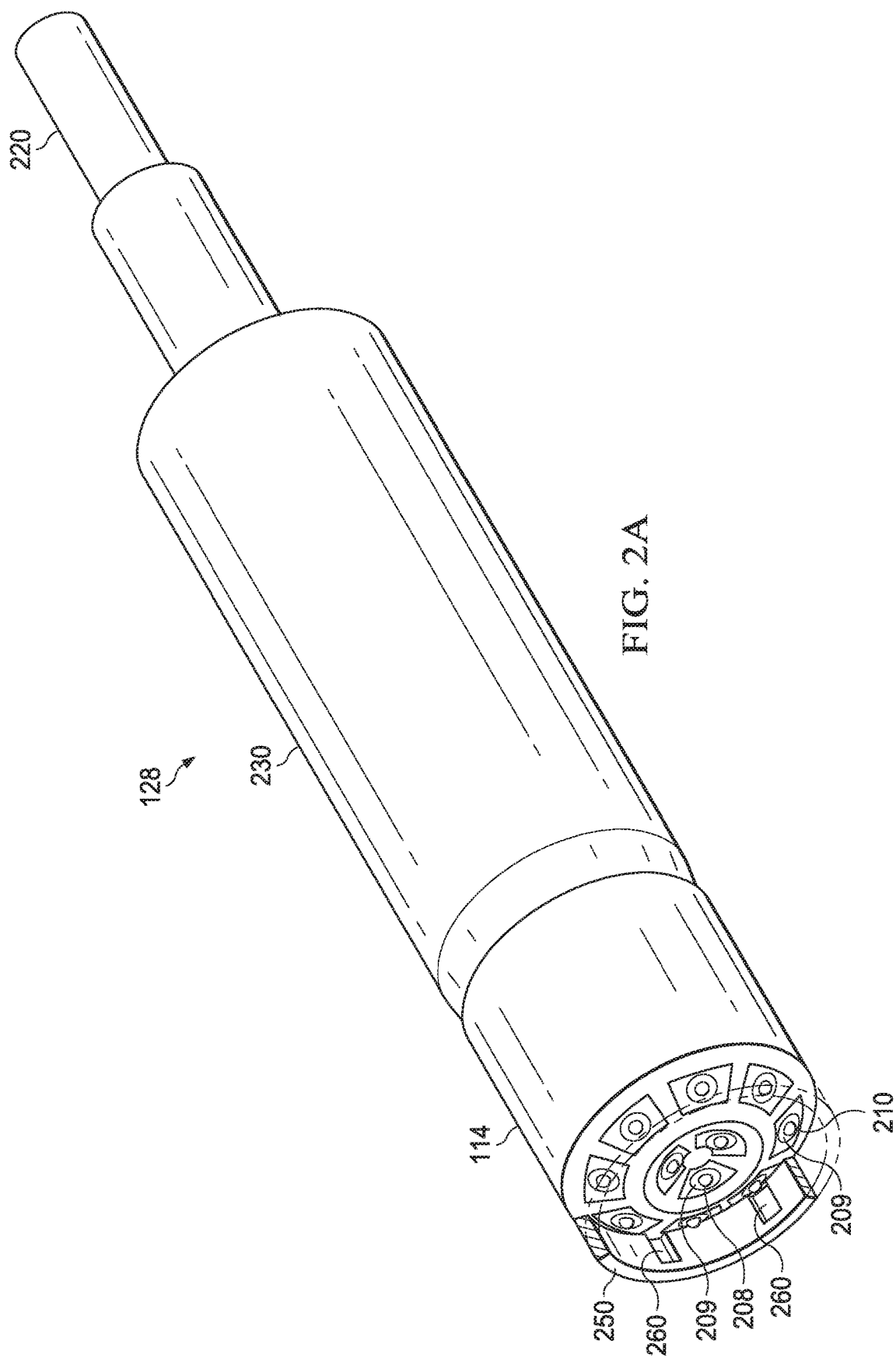
FIG. 2A is a perspective view of exemplary components of a bottom-hole assembly for a downhole electrocrushing drilling system.

FIG. 2A is a perspective view of exemplary components of the bottom-hole assembly for downhole electrocrushing drilling system 100. BHA 128 may include pulsed-power tool 230. BHA 128 may also include electrocrushing drill bit 114. For the purposes of the present disclosure, electrocrushing drill bit 114 may be integrated within BHA 128, or may be a separate component that is coupled to BHA 128.

Pulsed-power tool 230 may provide pulsed electrical energy to electrocrushing drill bit 114. Pulsed-power tool 230 receives electrical power from a power source via cable 220. For example, pulsed-power tool 230 may receive electrical power via cable 220 from a power source located on the surface as described above with reference to FIG. 1, or from a power source located downhole such as a generator powered by a mud turbine. Pulsed-power tool 230 may also receive electrical power via a combination of a power source located on the surface and a power source located downhole. Pulsed-power tool 230 converts electrical power received from the power source into high-energy electrical pulses that are applied across electrodes 208 and ground ring 250 of electrocrushing drill bit 114. Pulsed-power tool 230 may also apply high-energy electrical pulses across electrode 210 and ground ring 250 in a similar manner as described herein for electrode 208 and ground ring 250. Pulsed-power tool 230 may include a pulse-generating circuit as described below with reference to FIG. 3.

Referring to FIG. 1 and FIG. 2A, electrocrushing drilling fluid 122 may exit drill string 108 via openings 209 surrounding each electrode 208 and each electrode 210. The flow of electrocrushing drill fluid 122 out of openings 209 allows electrodes 208 and 210 to be insulated by the electrocrushing drilling fluid. Electrocrushing drill bit 114 may include a solid insulator (not expressly shown in FIG. 1 or 2A) surrounding electrodes 208 and 210 and one or more orifices (not expressly shown in FIG. 1 or 2A) on the face of electrocrushing drill bit 114 through which electrocrushing drilling fluid 122 exits drill string 108. Such orifices may be simple holes, or they may be nozzles or other shaped features. Because fines are not typically generated during electrocrushing drilling, as opposed to mechanical drilling, electrocrushing drilling fluid 122 may not need to exit the drill bit at as high a pressure as the drilling fluid in mechanical drilling. As a result, nozzles and other features used to increase drilling fluid pressure may not be needed. However, nozzles or other features to increase electrocrushing drilling fluid 122 pressure or to direct electrocrushing drilling fluid may be included for some uses.

Electrocrushing drilling fluid 122 is typically circulated through drilling system 100 at a flow rate sufficient to remove fractured rock from the vicinity of electrocrushing drill bit 114. In addition, electrocrushing drilling fluid 122 may be under sufficient pressure at a location in wellbore 116, particularly a location near a hydrocarbon, gas, water, or other deposit, to prevent a blowout.

In addition, electrocrushing drill bit 114 may include ground ring 250, shown in part in FIG. 2A. Ground ring 250 may function as an electrode. Although illustrated as a contiguous ring in FIG. 2A, ground ring 250 may be non-contiguous discrete electrodes and/or implemented in different shapes. Electrodes 208 and 210 may be at least 0.4 inches (i.e., at least approximately 10 millimeters) apart from ground ring 250 at their closest spacing, at least 1 inch apart at their closest spacing, at least 1.5 inches (i.e., at least approximately 38 millimeters) apart at their closest spacing, or at least 2 inches (i.e., at least approximately 51 millimeters) apart at their closest spacing. If drilling system 100 experiences vaporization bubbles in electrocrushing drilling fluid 122 near electrocrushing drill bit 114, the vaporization bubbles may have deleterious effects. For instance, vaporization bubbles near electrodes 208 or 210 may impede formation of the arc in the rock. Electrocrushing drilling fluid 122 may be circulated at a flow rate also sufficient to remove vaporization bubbles from the vicinity of electrocrushing drill bit 114. Although not all electrocrushing drill bits 114 may have ground ring 250, if it is present, it may contain passages 260 to permit the flow of electrocrushing drilling fluid 122 along with any fractured rock or bubbles away from electrodes 208 and 210 and uphole.

Figure 2B:
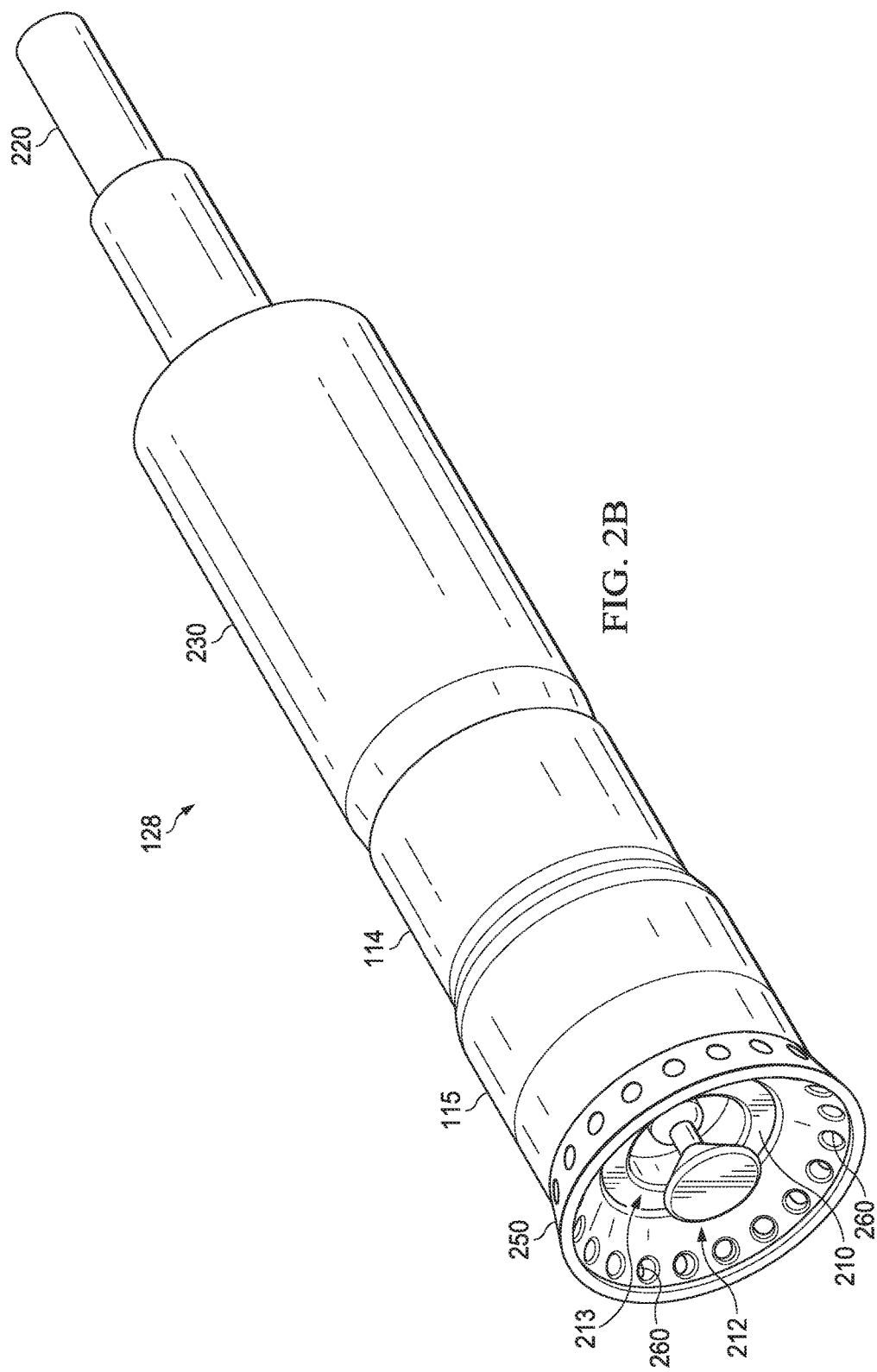
FIG. 2B is a perspective view of exemplary components of a bottom-hole assembly for a downhole electrocrushing drilling system.

FIG. 2B is another perspective view of exemplary components of a bottom-hole assembly for downhole electrocrushing drilling system 100. BHA 128 and pulsed-power tool 230 may include the same features and functionalities discussed above in FIG. 2A. For example, electrocrushing drilling fluid 122 may exit drill string 108 via opening 213 surrounding electrode 212. The flow of electrocrushing drill fluid 122 out of opening 213 allows electrode 212 to be insulated by the electrocrushing drilling fluid. While one electrode 212 is shown in FIG. 2B, electrocrushing drill bit 115 may include multiple electrodes 212. Electrocrushing drill bit 115 may include solid insulator 210 surrounding electrode 212 and one or more orifices (not expressly shown in FIG. 2B) on the face of electrocrushing drill bit 115 through which electrocrushing drilling fluid 122 exits drill string 108. Nozzles or other features to increase electrocrushing drilling fluid 122 pressure or to direct electrocrushing drilling fluid may be included for some uses. Additionally, the shape of solid insulator 210 may be selected to enhance the flow of electrocrushing drilling fluid 122 around the components of electrocrushing drill bit 115.

Electrocrushing drill bit 115 may include bit body 255, electrode 212, ground ring 250, and solid insulator 210. Electrode 212 may be placed approximately in the center of electrocrushing drill bit 115. The distance between electrode 212 and ground ring 250 may be generally symmetrical or may be asymmetrical such that the electric field surrounding the electrocrushing drill bit has a symmetrical or asymmetrical shape. The distance between electrode 212 and ground ring 250 allows electrocrushing drilling fluid 122 to flow between electrode 212 and ground ring 250 to remove vaporization bubbles from the drilling area.

Electrode 212 may have any suitable diameter based on the drilling operation. For example, electrode 212 may have a diameter between approximately two and approximately ten inches (i.e., between approximately 51 and approximately 254 millimeters). The diameter of the electrode may be based on the diameter of electrocrushing drill bit 115.

Ground ring 250 may function as an electrode and provide a location on the electrocrushing drill bit where an arc may initiate and/or terminate. Ground ring 250 also provides one or more fluid flow ports 260 such that electrocrushing drilling fluids flow through fluid flow ports 260 carry fractured rock and vaporization bubbles away from the drilling area.

Figure 3:
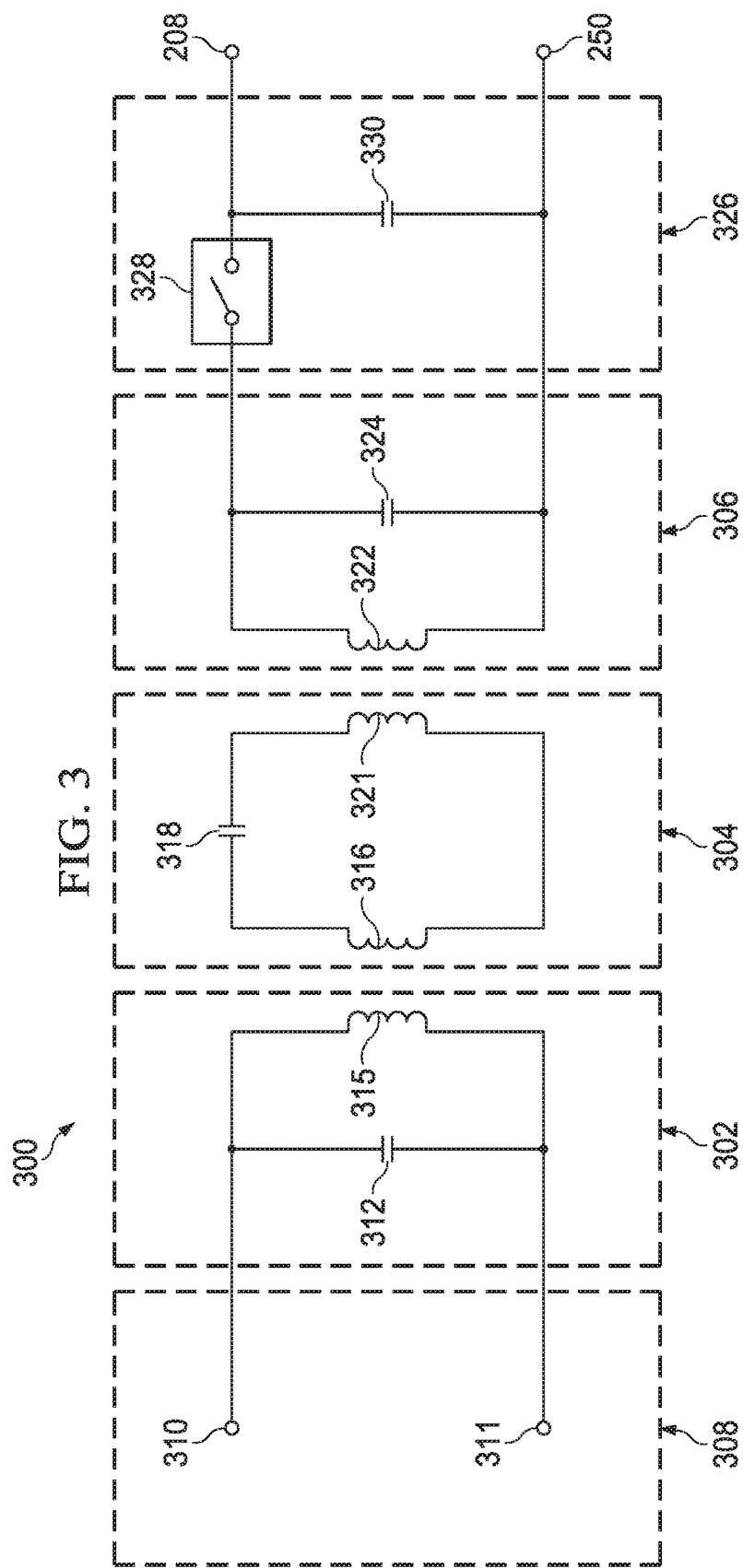
FIG. 3 is a schematic for an exemplary pulse-generating circuit for a downhole electrocrushing drilling system.

FIG. 3 is a schematic for an exemplary pulse-generating circuit for a downhole electrocrushing drilling system. Pulse-generating circuit 300 includes power source input 308, input stage tank circuit 302, series tank circuit 304, and output stage tank circuit 306. Pulse-generating circuit 300 may also include pulse compression circuit 326.

As described above with reference to FIGS. 2A and 2B, power source input 308 receives electrical power from a power source located on the surface (for example, generator 140 described with reference to FIG. 1) and/or a power source located downhole (for example, a generator powered by a mud turbine or an alternator). Power source input 308 may receive an alternating current with a peak current between approximately 50 and approximately 100 amps from a low-voltage power source (for example, approximately 1 kV to approximately 5 kV) by way of a cable, such as cable 220 described above with respect to FIGS. 2A and 2B. Pulse-generating circuit 300 uses electrical resonance to convert power from the power source into high-energy electrical pulses capable of applying at least 150 kV across electrode 208 or electrode 210 and ground ring 250 of electrocrushing drill bit 114 or electrode 212 and ground ring 250 of electrocrushing drill bit 115 with a rise time of approximately 5 to approximately 25 microseconds. As described above with reference to FIGS. 1 and 2, the high-energy electrical pulses at electrodes 208, 210 and 212 are utilized to drill wellbore 116 in subterranean formation 118.

Input stage tank circuit 302 is electrically driven by the power supplied at power source input 308. Input stage tank circuit 302 includes capacitor 312 and inductor 315 electrically coupled to power source input 308. Input stage tank circuit 302 stores energy from the power source and builds current in the circuit over time. Capacitor 312 and inductor 315 are arranged in parallel to form a parallel tank circuit. As a parallel tank circuit, input stage tank circuit 302 transfers energy stored in the circuit back and forth between capacitor 312 and inductor 315. As power source input 308 applies an alternating voltage to input terminals 310 and 311, electric current flows to capacitor 312, charging the plates of capacitor 312. As the voltage at power source input 308 decreases, the energy stored in capacitor 312 begins to discharge and causes current to flow through inductor 315, which causes a magnetic field in the coils of inductor 315. Inductor 315 generates current due to electrical reactance to resist the change in current caused by discharging capacitor 312, which recharges capacitor 312 with an opposite polarity. As the magnetic field in the coils of inductor 315 dissipates, the energy will again be stored in capacitor 312 as a result of the current induced by inductor 315. Capacitor 312 again discharges and sends current back in the opposite direction to inductor 315. If the reactance of capacitor 312 and inductor 315 are approximately equal, energy continues to oscillate back and forth between capacitor 312 and inductor 315 at a resonant frequency.

Current and energy build up in input stage tank circuit 302 over time when power source input 308 operates at approximately the same resonant frequency as capacitor 312 and inductor 315. For example, as the alternating voltage across input terminals 310 and 311 begins to increase, electric current flows to capacitor 312, charging the plates of capacitor 312. The power supply coupled to power source input 308 operates at approximately the same resonant frequency (for example, within the bandwidth of the resonant frequency) as capacitor 312 and inductor 315, power source input 308 charges capacitor 312 in parallel with inductor 315. Thus, energy from power source input 308 combines with the energy that was previously stored in input stage tank circuit 302 and is already resonating back and forth between capacitor 312 and inductor 315. The increased energy in input stage tank circuit 304 causes an increased current in input stage tank circuit 304.

Series tank circuit 304 includes inductors 316 and 321, and capacitor 318 connected in series, forming a series tank circuit. Series tank 304 increases the voltage in pulse-generating circuit 300 in addition to creating a low electromagnetic coupling to output stage tank circuit 306. Inductor 316 is electromagnetically coupled to inductor 315 of input stage tank circuit 302 such that current through inductor 315 causes current through inductor 316. For example, the windings of inductor 316 may be wound around the same core as the windings of inductor 315 to form a transformer. Thus, the alternating current in input stage tank circuit 302 induces a current through inductor 316 and thereby a current in series tank circuit 304. Current in series tank circuit 304 charges the plates of capacitor 318. As the current decreases, the energy stored in capacitor 318 begins to discharge and causes current to flow through inductors 316 and 321, which causes a magnetic field in the coils of inductors 316 and 321. Inductor 316 and 321 generate current due to electrical reactance to resist the change in current caused by discharging capacitor 318, which recharges capacitor 318 with an opposite polarity. When the magnetic fields in the coils of inductors 316 and 321 dissipate, the energy will again be stored in capacitor 318. Capacitor 318 again discharges and sends current back in the opposite direction to inductors 316 and 321. Maintaining the combined reactance of inductors 316 and 321 approximately equal to the reactance of capacitor 318 causes the total energy stored and current in series tank circuit 304 to increase over time in a similar manner as described above with respect to input stage tank circuit 302.

Output stage tank circuit 306 stores increased energy to apply to electrodes 208, 210, or 212 and ground ring 250 of the electrocrushing drill bit. Output stage tank circuit 306 includes inductor 322 and capacitor 324 connected in parallel to form a parallel tank circuit similar to that of input stage tank circuit 302 discussed above. Inductor 322 is electromagnetically coupled to inductor 321 of series tank circuit 304, such that current through inductor 321 generates current through inductor 322. For example, the windings of inductor 322 may be wound around the same core as the windings of inductor 321 to form a transformer. Series tank circuit 304 may have a step-up coupling to output stage tank circuit 306 such that inductor 322 has a greater number of windings than inductor 321. The step-up winding causes an increased voltage in output stage tank circuit 306 compared to series tank circuit 304. Current generated by the electromagnetic coupling of inductor 322 charges capacitor 324. When the reactance of inductor 322 and capacitor 324 is approximately equal (for example, such that inductor 322 and capacitor 324 operate within the bandwidth of the resonant frequency), energy oscillates between inductor 322 and capacitor 324 at a resonant frequency, such that the total energy stored and current in output stage tank circuit 306 increases over time for the same reasons discussed above with respect to input stage tank circuit 302 and series tank circuit 304. After sufficient time, the energy stored in capacitor 324 may increase to a voltage sufficient for electrocrushing drilling (for example, approximately 150 kV or a voltage sufficient to create an electrical arc through a rock formation near the drill bit).

As a result of electrical resonance between input stage tank circuit 302, series tank circuit 304, and output stage tank circuit 306, the energy stored in pulse-generating circuit 300 steadily increases over time to create high-energy pulses for electrocrushing drilling. Input stage tank circuit 302, series tank circuit 304, and output stage tank circuit 306 operate at approximately the same resonant frequency (for example, within the bandwidth of the frequency of power supply coupled to power source input 308) to steadily increase the energy in pulse-generating circuit 300 over time. Input stage tank circuit 302 increases the input current driving pulse-generating circuit 300 by combining the alternating current from power source input 308 with current oscillating between capacitor 312 and inductor 315. Series tank circuit 304 increases the voltage in pulse-generating circuit 300 with a step-up coupling to output stage tank circuit 326. The increased voltage in the output stage tank circuit 326 is stored in capacitor 324. In this manner, pulse-generating circuit 300 uses electrical resonance to transform input from a low-power source into high-energy electrical pulses capable of electrocrushing drilling.

Pulse-generating circuit 300 may also include pulse compression circuit 326 to reduce the rise time of the high-energy electrical pulses at output stage tank circuit 306. Pulse compression circuit 326 includes switching circuit 328 and capacitor 330. Switching circuit 328 includes any suitable device to open and close the electrical path between capacitor 324 and capacitor 330. For example, switching circuit 328 may include a mechanical switch, a solid-state switch, a magnetic switch, a gas switch, or any other type of switch suitable to open and close the electrical path between capacitor 324 and capacitor 330. Switching circuit 328 is open as output stage tank circuit 308 charges capacitor 324 over the period time of the resonant frequency. When switching circuit 328 is closed, electrical current flows from capacitor 324 to quickly charge capacitor 330 to the same electric potential as capacitor 324. Thus, switching circuit 328 may reduce the rise time of the high-energy pulse from output stage tank circuit 306 by shorting capacitors 324 and 330 when switching circuit 328 is closed. The electric potential across capacitor 330 is applied across electrodes 208 and ground ring 250. To increase the power from electrocrushing drill bit 114 into the formation, the high-energy pulse may rise from zero to peak voltage in approximately 5 to approximately 25 microseconds. In some embodiments, switching circuit 328 may adjust the high-energy pulse to rise from zero to peak voltage in approximately 100 nanoseconds to approximately 200 microseconds. When power source input 308 operates with a slower rise time, capacitor 324 of output stage tank circuit 308 may charge at the slower rise time. Pulse compression circuit 326 may reduce the rise time of the voltage at the output electrodes by closing the electrical path between capacitor 324 and capacitor 330 such that capacitor 330 charges at a faster rate than the rise time of power source input 308. A faster rise in the output voltage applied to electrode 208 may cause higher peak-power electrical pulses, ensuring efficient energy transfer from electrode 208 to the formation.

Electrode 208 and ground ring 250 are coupled to opposing terminals of capacitor 330 of pulse compression circuit 326. Accordingly, as the electric potential across capacitor 330 increases, the electric potential across electrode 208 and ground ring 250 also increases. The capacitance of capacitors 324 and 330 may be approximately equal such that the electric potential between the capacitors is approximately equal when switching circuit 328 is closed. In addition, an approximately equal capacitance between capacitors 324 and 330 may reduce variations in the rise or fall time of the electric potential across electrode 208 and ground ring 250. And, as described above with reference to FIG. 1, when the electric potential across the electrodes (for example, electrode 208 and ground ring 250) of an electrocrushing drill bit becomes sufficiently large, an electrical arc forms through a rock formation that is near electrode 208 and ground ring 250. The arc provides a temporary electrical short between electrode 208 and ground ring 250, and thus allows electric current to flow through the arc inside a portion of the rock formation at the bottom of wellbore. As described above with reference to FIG. 1, the arc increases the temperature of the portion of the rock formation through which the arc flows and the surrounding formation and materials. The temperature is sufficiently high to vaporize any water or other fluids that might be touching or near the arc and may also vaporize part of the rock itself. The vaporization process creates a high-pressure gas which expands and, in turn, fractures the surrounding rock.

As described below with respect to FIG. 4, pulse-generating circuit 300 may be physically sized to fit downhole. The physical size of pulse-generating circuit 300 may depend on the size of the transformers between input stage tank circuit 302 and series tank circuit 304, and series tank circuit 304 and output stage tank circuit 306. The windings of inductor 315 of input stage tank circuit 302 and the windings of inductor 316 of series tank circuit 304 are wrapped around a common core to form a transformer. The windings of inductor 321 of series tank circuit 304 and the windings of inductor 322 of output stage tank circuit 306 are wrapped around a common core to form another transformer. The inductors of each transformer are electromagnetically coupled, such that current through one inductor induces current in the other inductor to which it is electromagnetically coupled. The electromagnetic coupling and the amount of induced current is proportional to the magnetic permeability of the core material around which the inductors are wound, the cross-sectional area of the core, the number of windings in the inductors, the length of the windings, and the relative positioning of the windings. The electromagnetic coupling may be expressed as a coupling coefficient, a fractional number between 0 and 1, where a lower coupling coefficient represents a smaller electromagnetic coupling and a higher coupling coefficient represents a higher electromagnetic coupling. The higher the coupling coefficient, the higher the induced current in the other inductor in the transformer.

To reduce the physical size of the pulse-generating circuit 300, the transformers in the circuit may be designed with a lower electromagnetic coupling. For example, the electromagnetic coupling between input stage tank circuit 302 and series tank circuit 304 (the transformer formed by inductors 315 and 316), and series tank circuit 304 and output stage tank circuit 306 (the transformer formed by inductors 321 and 322) may have a coupling coefficient between approximately 0 and 0.3. A lower electromagnetic coupling may allow for less core material and fewer windings in the inductor so that the physical size of pulse-generating circuit 300 may be reduced. A smaller physical size of pulse-generating circuit 300 may allow the circuit to fit within a diameter of approximately five to six inches (i.e., approximately 127 to 152 millimeters), or the diameter of pulsed-power tool 230 as illustrated below with reference to FIG. 4. The transformers in pulse-generating circuit 300 may have an air core, or no core material between the windings of the inductors. The transformers in pulse-generating circuit 300 may use an air core with supplemental core material to intercept and concentrate the flux along the internal diameter of the windings of the inductors. The supplemental core material may include a cobalt-iron alloy such as supermendur, which may include approximately forty-eight percent cobalt, approximately forty-eight percent iron, and approximately two percent vanadium by weight. The supermendur material maintains its high relative permeability across a wide range of temperatures (for example, from approximately 10 to approximately 200 degrees Centigrade), and thus withstands the high temperatures of a downhole environment. The supplemental core material may also include a ferrite material, a strip laminate magnetic material with a Curie temperature greater than 200 degrees Centigrade, Metglas®, which includes a thin amorphous metal alloy ribbon which may be magnetized and demagnetized, or other high magnetic permeability material that maintains its magnetic permeability across a range of downhole temperatures (for example, from approximately 10 to approximately 200 degrees Centigrade) such as Silectron™ (for example, silicon steel material composed of approximately 3% silicon steel and 97% iron) and Supermalloy™ (for example, composed of approximately 80% Nickel-Iron and 20% iron alloy).

A lower electromagnetic coupling between the inductors in pulse-generating circuit 300 may also improve the reliability of pulsed-power tool 230 and the drilling system. The electrical arc created by the short between electrode 208 and ground ring 250 may cause high transient current to flow back into pulse-generating circuit 300. Transient current may damage elements within pulse-generating circuit 300 and/or other elements of the drilling system as the current propagates back towards power source input 308. A lower electromagnetic coupling between input stage tank circuit 302 and series tank circuit 304 (the transformer formed by inductors 315 and 316), and series tank circuit 304 and output stage tank circuit 306 (the transformer formed by inductors 321 and 322) reduces the amount of any transient current as the current travels from the output stage tank circuit 306 to the input stage tank circuit 302. In addition, a step-up coupling between series tank circuit 304 and output stage tank circuit 306 may further isolate a power surge caused by a transient current as any voltage from the transient current will experience a step-down coupling from output stage tank circuit 306 to series tank circuit 304. Thus, a step-up coupling from series tank circuit 304 to output stage tank circuit 306, like the lower electromagnetic coupling between the inductors in pulse-generating circuit 300, may electrically isolate transient currents in pulse-generating circuit 300.

To ensure electrical resonance within pulse-generating circuit 300, the circuit elements may be selected based on the operating frequency of power source input 308. As described above, electrical resonance is achieved by approximately matching the reactance of the capacitor and inductor(s) at each stage of pulse-generating circuit 300 such that each stage operates within the bandwidth of the resonant frequency. For example, when power source input 308 operates at 5 kilohertz, electrical resonance in pulse-generating circuit 300 may be achieved when capacitor 312 is 1 microfarad (µF), inductors 315 and 316 are 1 millihenry (mH), capacitor 318 is 240 nanofarad (nF), inductor 321 is 100 mH, inductor 322 is 20 mH, and capacitor 324 is 51 nF.

However, the reactance of each element may change based on the operating conditions. For example, the frequency of power source input 308, the output power of the pulse-generating circuit, and the operating temperature may affect the reactance of the circuit elements. Thus, the capacitors and inductors within pulse-generating circuit 300 may be selected based on the frequency of the power source input (for example, between approximately 400 hertz and approximately 10 megahertz), the output power of the pulse-generating circuit (for example, from approximately 1 kilowatt and approximately 2 megawatt), and/or the temperature in the wellbore (for example, from approximately 10 to approximately 200 degrees Centigrade). Given the frequency of the power source input, desired output power of the pulse-generating circuit, and/or temperature in the wellbore, the values of the circuit elements that achieve electrical resonance within pulse-generating circuit 300 (for example, such that input stage tank circuit 302, series tank circuit 304, and output stage tank circuit 306 operate within the bandwidth of the resonant frequency, so that the energy stored in pulse-generating circuit 300 steadily increases over time to create high-energy pulses for electrocrushing drilling) may be determined by circuit simulations or calculations. For example, within input stage tank circuit 302, inductor 315 may be between approximately 100 nH and 100 mH, and capacitor 312 may be between approximately 10 picofarad (pF) and 100 millifarad (mF). Once the values of inductor 315 and capacitor 312 are set, the elements within series tank circuit 304 and output stage tank circuit 306 may be selected such that at each circuit operates within the bandwidth of the resonant frequency.

Generating high-energy electrical pulses downhole as opposed to the surface of the wellbore may allow the electrocrushing drilling system to perform more efficiently. As described above, pulse-generating circuit 300 uses electrical resonance to convert a low-amperage (for example, 50 to 100 amps) alternating current from a low-voltage (for example, 1 kV to 5 kV) power source into high-energy electrical pulses capable of applying a high voltage (for example, approximately 150 kV or a voltage sufficient to create an electrical arc through a rock formation near the drill bit) across electrode 208 and ground ring 250 of electrocrushing drill bit with a 5 to 25 microseconds rise time. Thus, low-power electrical waves transported downhole are transformed into high-energy electrical pulses near the electrocrushing drill bit. Transporting low-power electrical pulses downhole may reduce energy loss and equipment expense associated with transporting the high-energy electrical pulses long distances, such as from surface to downhole. For example, an uphole power source may supply power downhole to pulse-generating circuit 300 by way of a cable, such as cable 220 described above with respect to FIGS. 2A and 2B. A fraction of the power from the uphole power source may be lost during the transmission downhole because of the electrical impedance of the cable. Thus, reducing the amount of power transmitted downhole may reduce the amount of transmission loss.

Although FIG. 3 is a schematic for a particular pulse-generating circuit topology, electrocrushing drilling systems and pulsed-power tools may utilize any suitable pulse-generating circuit topology to generate and apply high-energy pulses to across electrode 208 and ground ring 250. Such pulse-generating circuit topologies may utilize electrical resonance to generate the high-energy electrical pulses required for electrocrushing drilling. Elements may be added or removed from the schematic illustrated in FIG. 3 without deviating from the present invention. For example, when pulse compression is not needed, capacitor 324 of output stage tank circuit 306 may be coupled directly to electrode 208 and ground ring 250, eliminating pulse compression circuit 326.

Figure 4:
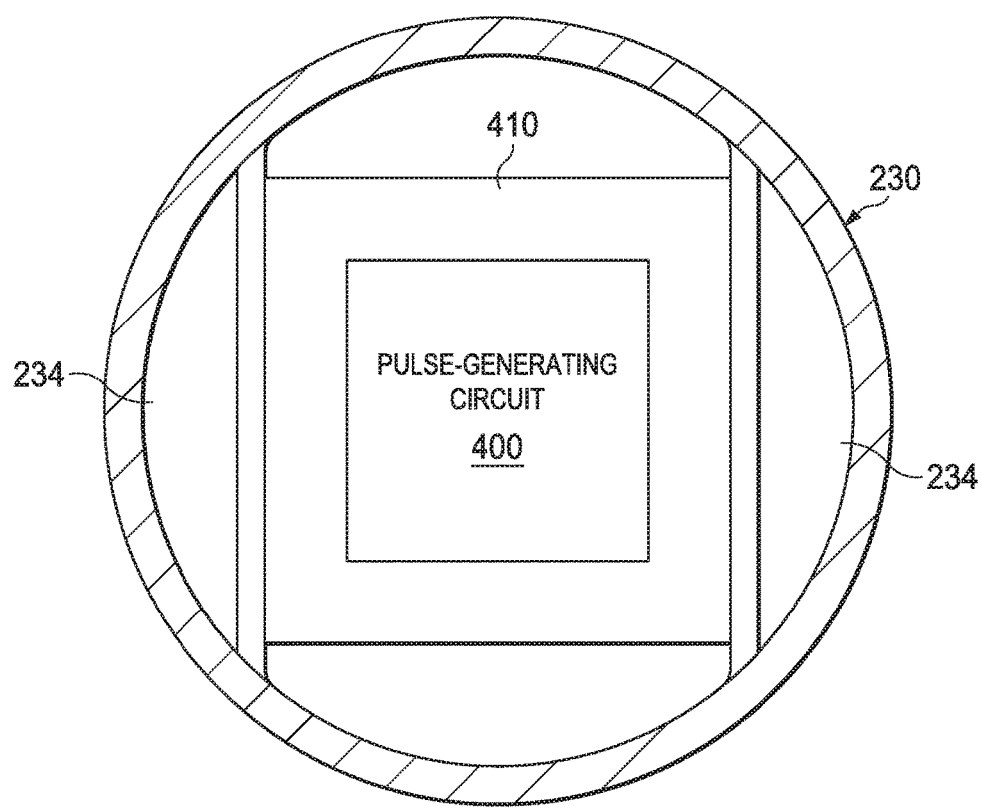
FIG. 4 is a top cross-sectional view of an exemplary pulsed-power tool for a downhole electrocrushing drilling system.

FIG. 4 is a top cross-sectional view of an exemplary pulsed-power tool for a downhole electrocrushing drilling system. Pulse-generating circuit 400 may serve, for example, as a pulse-generating circuit for an electro-crushing drill bit similar to pulse-generating circuit 300 depicted in FIG. 3. Pulse-generating circuit 400 may be shaped and sized to fit within the circular cross-section of pulsed-power tool 230, which as described above with reference to FIGS. 2A and 2B, may form part of BHA 128. For example, pulse-generating circuit 400 may be shaped and sized to fit within pulsed-power tool 230. Moreover, pulse-generating circuit 400 may be enclosed within encapsulant 410. Encapsulant 410 includes a thermally conductive material to protect pulse-generating circuit 400 from the wide range of temperatures (for example, from approximately 10 to approximately 200 degrees Centigrade) within the wellbore. For example, encapsulant 410 may include APTEK® 2100-A/B, which is a two component, unfilled, electrically insulating urethane system for the potting and encapsulation of electronic components, and has a thermal conductivity of approximately 170 mW/mK. Encapsulant 410 may include one or more other thermally conductive materials with a dielectric strength greater than approximately 350 volt/mil (for example, greater than approximately 13,780 volt/millimeter) and a temperature capability greater than approximately 120 degrees Centigrade, such as DOW CORNING® OE-6636 and OE-6550. Encapsulant 410 adjoins an outer wall of one or more fluid channels 234. As described above with reference to FIG. 1, drilling fluid 122 passes through fluid channels 234 as drilling fluid is pumped down through a drill string. Encapsulant 410 transfers heat generated by pulse-generating circuit 400 to the drilling fluid that passes through fluid channels 234. Thus, encapsulant 410 may prevent pulse-generating circuit 400 from overheating to a temperature that degrades the relative permeability of core of the cores of the inductors in pulse-generating circuit 400.

Figure 5:
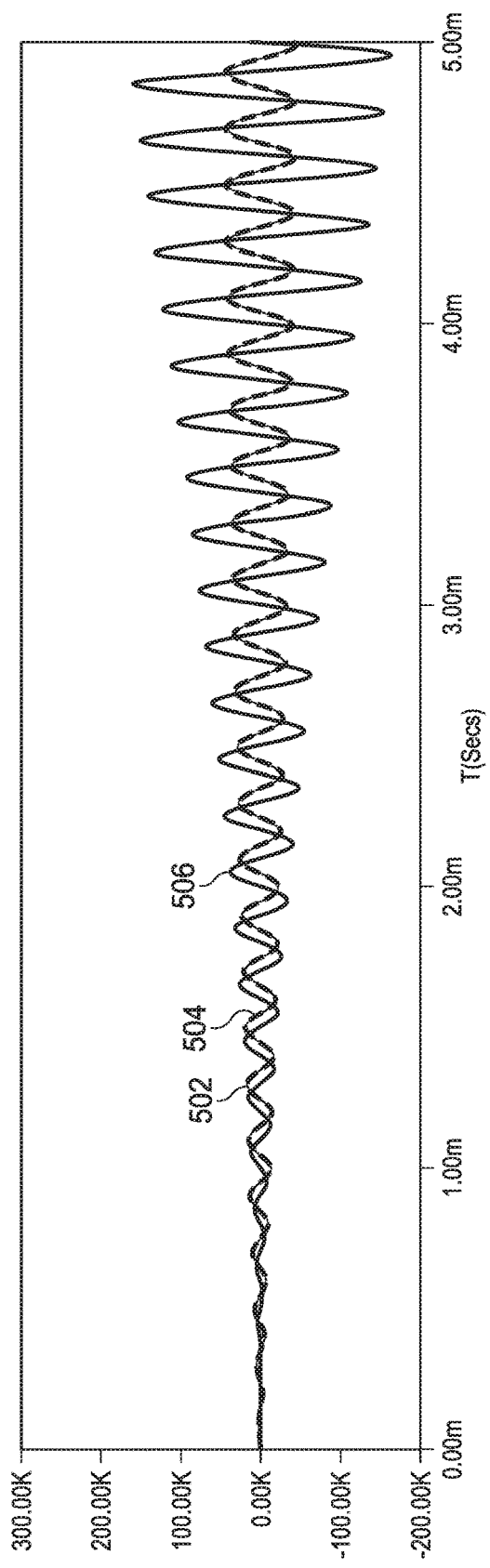
FIG. 5 is a graph illustrating the operational voltages of elements in a pulse-generating circuit.

FIG. 5 is a graph illustrating the operational voltages of elements in a pulse-generating circuit. Each of plots 502, 504, and 506 represents a voltage, or electric potential, across a capacitor over time in a pulse-generating circuit, such as pulse-generating circuit 300 described above with reference to FIG. 3. For example, plot 502 represents the voltage across capacitor 312 of input stage tank circuit 302, plot 504 may represent the voltage across capacitor 318 of series tank circuit 304, and plot 506 may represent the voltage across capacitor 324 of output stage tank circuit 306. As illustrated by plots 502, 504, and 506, the voltages of the capacitors in the pulse-generating circuit continually increase over time as a result of electrical resonance.

The graph in FIG. 5 represents the operation of a pulse-generating circuit with 1 kV/60 A power source input operating at 5 kilohertz. When the input stage tank circuit, series tank circuit, and output stage tank circuit of the pulse-generating circuit resonate at the same frequency as the power source input, the 1 kV input voltage applied at time 0 ms, is transformed to a 150 kV output voltage at time 5 ms. At time 5 ms, the voltage at the output stage tank circuit reaches 150 kV which is applied across the electrode and ground ring of an electrocrushing drill bit to form an electrical arc through a rock formation that is in contact with or near electrode and ground ring. The arc may provide a temporary electrical short between the electrode and the ground ring, such that the charge built up at the output stage tank circuit discharges at a high current level into the formation. As described above with reference to FIG. 1, the arc may vaporize fluid and/or the rock in the formation, thereby fracturing the surrounding rock.

Figure 6:
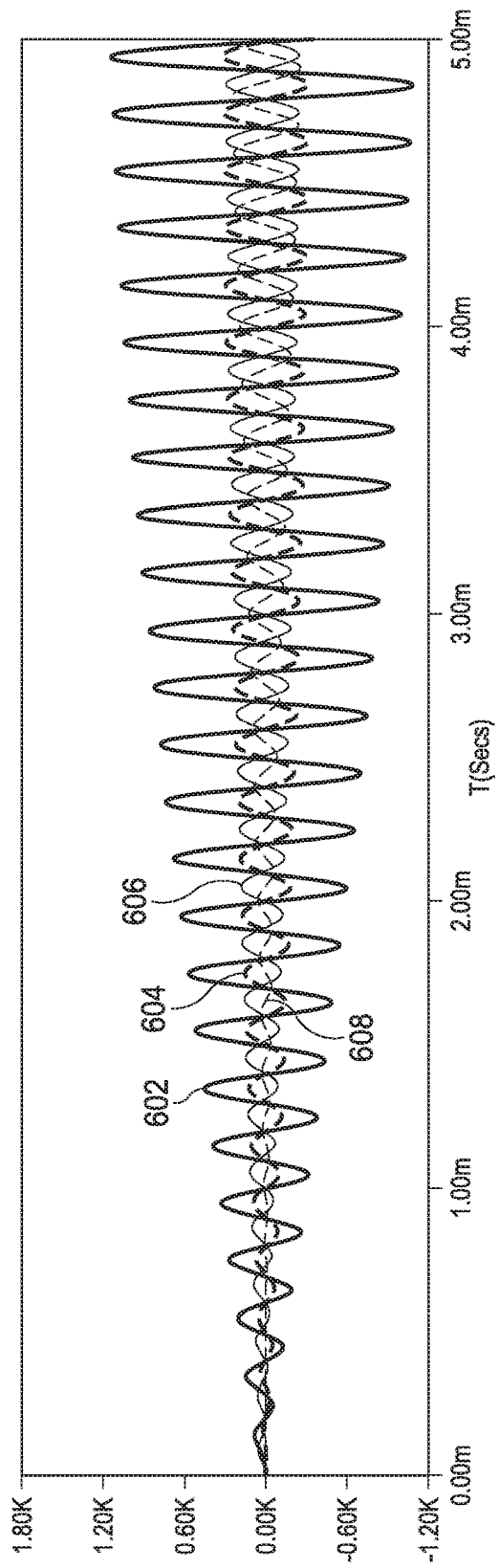
FIG. 6 is a graph illustrating the operational currents of elements in a pulse-generating circuit.

FIG. 6 is a graph illustrating the operational currents of elements in a pulse-generating circuit. Each of plots 602, 604, 606, and 608 represents a current though an inductor over time in a pulse-generating circuit, such as pulse-generating circuit 300 described above with reference to FIG. 3. For example, plot 602 may represent the current through inductor 315 of input stage tank circuit 302, plots 604 and 606 may represent the current through inductors 316 and 321 respectively of series tank circuit 304, and plot 608 may represent the current through inductor 322 of output stage circuit 306. As illustrated by plots 602, 604, 606, and 608, the currents through the inductors in the pulse-generating circuit may continually increase over time as a result of electrical resonance.

The graph in FIG. 6 represents the operation of a pulse-generating circuit with 1 kV/60 A power source input operating at 5 kilohertz. When the input stage tank circuit, series tank circuit, and output stage tank circuit of the pulse-generating circuit resonate at the same frequency as the power source input, the 60 A input current applied to the input stage tank circuit at time 0 ms is transformed to a 1000 A current at time 5 ms. The lowest current, plot 608, corresponds to the inductor in the output stage tank circuit (for example, 322 of FIG. 3) where the voltage has been stepped up to apply across the electrode and ground ring of an electrocrushing drill bit. The largest current, plot 602, corresponds to the inductor in the input stage tank circuit, the first stage of the pulse-generating circuit. Current in the input stage tank circuit provides the power to the remainder of the pulse-generating circuit. The increased current is the result of electrical resonance, allowing the pulse-generating circuit to generate high-energy pulses from a low-power power source input.

Figure 7:
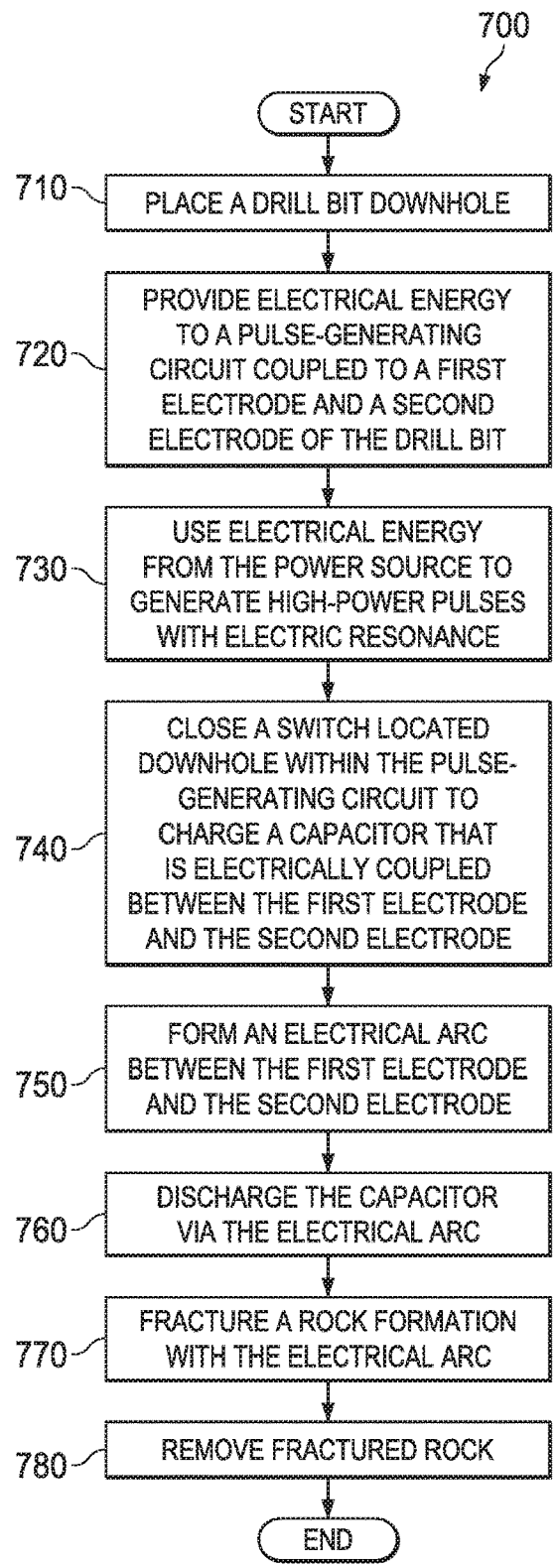
FIG. 7 is a flow chart of exemplary method for drilling a wellbore.

FIG. 7 illustrates a flow chart of exemplary method for drilling a wellbore.

Method 700 may begin and at step 710 an electrocrushing or electrohydraulic drill bit may be placed downhole in a wellbore. For example, drill bit 114 may be placed downhole in wellbore 116 as shown in FIG. 1.

At step 720, electrical energy is provided to a pulse-generating circuit coupled to a first electrode and a second electrode of the drill bit. The first electrode may be electrode 208, 210, or 212 and the second electrode may be ground ring 250 discussed above with respect to FIGS. 2A and 2B. For example, as described above with reference to FIG. 3, pulse-generating circuit 300 may be implemented within pulsed-power tool 230 of FIGS. 2A and 2B. And as described above with reference to FIGS. 2A and 2B, pulsed-power tool 230 may receive electrical power from a power source on the surface, from a power source located downhole, or from a combination of a power source on the surface and a power source located downhole. Power may be supplied downhole to pulse-generating circuit 300 by way of a cable, such as cable 220 described above with respect to FIGS. 2A and 2B. The power may be provided to pulse-generating circuit 300 within pulse-power tool 230 at power source input 308.

At step 730, the pulse-generating circuit converts the electrical power from the power source into high-energy electrical pulses for use of the electrocrushing drill bit. For example, as described above with reference to FIG. 3, pulse-generating circuit 300 may include an input stage tank circuit, series tank circuit, and an output stage tank circuit operating at a resonant frequency. Electrical resonance allows the energy to continually increase over time such that the pulse-generating circuit 300 generates high-energy pulses from a low-power power source input for the electrocrushing drilling system. For example, the pulse-generating circuit may use electrical resonance to convert a low-voltage power source (for example, approximately 1 kV to approximately 5 kV) into high-energy electrical pulses capable of applying at least 150 kV across electrodes of the drill bit.

At step 740, a switch located downhole within the pulse-generating circuit may close to charge a capacitor that is electrically coupled between the first electrode and the second electrode. For example, switching circuit 328 of pulse compression circuit 326 may close to generate an electrical pulse and may be open between pulses. Switching circuit 328 may include a solid-state switch or a magnetic switch. As described above with reference to FIG. 3, switching circuit 328 may switch to close the electrical path between capacitor 324 and capacitor 330. When switching circuit 328 is closed, electrical current flows from capacitor 324 to capacitor 330. As shown in FIGS. 2 and 3, the pulse generating circuit may be coupled to a first electrode (such as electrode 208, 210, or 212) and a second electrode (such as ground ring 250) of drill bit 114. Capacitor 330 of pulse-generating circuit 300 may be coupled between a first electrode (such as electrode 208, 210, or 212) and a second electrode (such as ground ring 250) of drill bit 114. Accordingly, as the voltage across capacitor 330 increases, the voltage across first electrode and the second electrode increases. Pulse compression circuit 326 may decrease the rise time of the electric potential applied across electrode 208 and ground ring 250. For example, the rise time of the electric potential may be compressed to time between approximately 5 to approximately 25 microseconds.

At step 750, an electrical arc may be formed between the first electrode and the second electrode of the drill bit. And at step 760, the capacitor may discharge via the electrical arc. For example, as the voltage across capacitor 330 increases during step 740, the voltage across the first electrode and the second electrode also increases. As described above with reference to FIGS. 1 and 2, when the voltage across electrode 208 and ground ring 250 becomes sufficiently large, an arc may form through a rock formation that is in contact with or near electrode 208 and ground ring 250. The arc may provide a temporary electrical short between electrode 208 and ground ring 250, and thus may discharge, at a high current level, the voltage built up across capacitor 330.

At step 760, the rock formation at an end of the wellbore may be fractured with the electrical arc. For example, as described above with reference to FIGS. 1 and 2, the arc greatly increases the temperature of the portion of the rock formation through which the arc flows as well as the surrounding formation and materials. The temperature is sufficiently high to vaporize any water or other fluids that may be touching or near the arc and may also vaporize part of the rock itself. The vaporization process creates a high-pressure gas which expands and, in turn, fractures the surrounding rock.

At step 770, fractured rock may be removed from the end of the wellbore. For example, as described above with reference to FIG. 1, electrocrushing drilling fluid 122 may move the fractured rock away from the electrodes and uphole away from the drill bit. As described above with respect to FIGS. 2A and 2B, electrocrushing drilling fluid 122 and the fractured rock may pass away from electrodes through passages 260 in the drill bit. Subsequently, method 700 may end.

Modifications, additions, or omissions may be made to method 700 without departing from the scope of the disclosure. For example, the order of the steps may be performed in a different manner than that described and some steps may be performed at the same time. Additionally, each individual step may include additional steps without departing from the scope of the present disclosure. As another example, step 740 may be skipped when the rise time of the power source input is short enough such that pulse compression is not required.

Embodiments herein may include:

A. A downhole drilling system including a pulse-generating circuit electrically coupled to a power source to provide power at a frequency, the pulse-generating circuit comprising an input stage tank circuit electrically coupled to the power source, the input stage tank circuit configured to have a resonant frequency approximately equal to the frequency; a series tank circuit electromagnetically coupled to the input stage tank circuit, the series tank circuit configured to have a resonant frequency approximately equal to the frequency; and an output stage tank circuit electromagnetically coupled to the series tank circuit, the output stage tank circuit configured to have a resonant frequency approximately equal to the frequency; and a drill bit including a first electrode and a second electrode electrically coupled to the output stage tank circuit to receive an electric pulse from the pulse-generating circuit.

B. A method including placing a drill bit downhole in a wellbore; providing electrical power from a power source at a frequency to a pulse-generating circuit electrically coupled to the drill bit; generating an electric pulse with the pulse-generating circuit, the electric pulse stored in an output capacitor and generated by electrical resonance at the frequency; forming an electrical arc between a first electrode and a second electrode of the drill bit, the first electrode and the second electrode electrically coupled to the output capacitor; discharging the output capacitor by the electrical arc; fracturing a rock formation at an end of the wellbore with the electrical arc; and removing fractured rock from the end of the wellbore.

Each of embodiments A and B may have one or more of the following additional elements in any combination: Element 1: wherein the input stage tank circuit comprises a capacitor and an inductor configured to have approximately equal electrical reactance at the frequency. Element 2: wherein the series tank circuit comprises a capacitor, a first inductor, and a second inductor in series configured to have approximately equal electrical reactance at the frequency. Element 3: wherein the output stage tank circuit comprises a capacitor and an inductor in parallel configured to have approximately equal electrical reactance at the frequency. Element 4: wherein the input stage tank circuit, series tank circuit, and output stage tank circuit are electromagnetically coupled by a plurality of inductors configured to have a coupling coefficient between 0 and 0.3. Element 5: wherein the pulse-generating circuit further comprises a pulse compression circuit configured to compress a rise time of an electric pulse from the output stage tank circuit before the electric pulse is applied to the first electrode and the second electrode of the drill bit. Element 6: wherein the electric pulse compression circuit comprises a magnetic switch and a capacitor in series. Element 7: wherein the frequency is less than 100 MHz. Element 8: wherein the electric pulse from the pulse-generating circuit applies a voltage of approximately 150 kV across the first electrode and the second electrode. Element 9: wherein the drill bit is integrated within the bottom-hole assembly. Element 10: wherein the drill bit is one of an electrocrushing drill bit and an electrohydraulic drill bit. Element 11: wherein the pulse-generating circuit comprises an input stage tank circuit electrically coupled to the power source, the input stage tank circuit configured to have a resonant frequency approximately equal to the frequency; a series tank circuit electromagnetically coupled to the input stage tank circuit, the series tank circuit configured to have a resonant frequency approximately equal to the frequency; and an output stage tank circuit electromagnetically coupled to the series tank circuit, the output stage tank configured to have a resonant frequency approximately equal to the frequency. Element 12: wherein the second electrode is a ground ring.

Although the present disclosure has been described with several embodiments, various changes and modifications may be suggested to one skilled in the art. It is intended that the present disclosure encompasses such various changes and modifications as falling within the scope of the appended claims.

What is claimed is:

1. A downhole drilling system, comprising:
a pulse-generating circuit electrically coupled to a power source to provide power at a frequency, the pulse-generating circuit comprising:
an input stage tank circuit electrically coupled to the power source, the input stage tank circuit configured to have a resonant frequency approximately equal to the frequency;
a series tank circuit electromagnetically coupled to the input stage tank circuit, the series tank circuit configured to have a resonant frequency approximately equal to the frequency; and
an output stage tank circuit electromagnetically coupled to the series tank circuit, the output stage tank circuit configured to have a resonant frequency approximately equal to the frequency; and
a drill bit including a first electrode and a second electrode electrically coupled to the output stage tank circuit to receive an electric pulse from the pulse-generating circuit.

2. The downhole drilling system of claim 1, wherein the input stage tank circuit comprises a capacitor and an inductor configured to have approximately equal electrical reactance at the frequency.

3. The downhole drilling system of claim 1, wherein the series tank circuit comprises a capacitor, a first inductor, and a second inductor in series configured to have approximately equal electrical reactance at the frequency.

4. The downhole drilling system of claim 1, wherein the output stage tank circuit comprises a capacitor and an inductor in parallel configured to have approximately equal electrical reactance at the frequency.

5. The downhole drilling system of claim 1, wherein the input stage tank circuit, series tank circuit, and output stage tank circuit are electromagnetically coupled by a plurality of inductors configured to have a coupling coefficient between 0 and 0.3.

6. The downhole drilling system of claim 1, wherein the pulse-generating circuit further comprises a pulse compression circuit configured to compress a rise time of an electric pulse from the output stage tank circuit before the electric pulse is applied to the first electrode and the second electrode of the drill bit.

7. The downhole drilling system of claim 6, wherein the electric pulse compression circuit comprises a magnetic switch and a capacitor in series.

8. The downhole drilling system of claim 1, wherein the frequency is less than 100 MHz.

9. The downhole drilling system of claim 1, wherein the electric pulse from the pulse-generating circuit applies a voltage of approximately 150 kV across the first electrode and the second electrode.

10. The downhole drilling system of claim 1, wherein the drill bit is integrated within a bottom-hole assembly.

11. The downhole drilling system of claim 1, wherein the drill bit is one of an electrocrushing drill bit and an electrohydraulic drill bit.

12. The downhole drilling system of claim 1, wherein the second electrode is a ground ring.

13. A method, comprising:
placing a drill bit downhole in a wellbore;
providing electrical power from a power source at a frequency to a pulse-generating circuit electrically coupled to the drill bit, the pulse-generating circuit including:
an input stage tank circuit electrically coupled to the power source, the input stage tank circuit configured to have a resonant frequency approximately equal to the frequency;
a series tank circuit electromagnetically coupled to the input stage tank circuit, the series tank circuit configured to have a resonant frequency approximately equal to the frequency; and
an output stage tank circuit electromagnetically coupled to the series tank circuit, the output stage tank configured to have a resonant frequency approximately equal to the frequency;

generating an electric pulse with the pulse-generating circuit, the electric pulse stored in an output capacitor and generated by electrical resonance at the frequency;

forming an electrical arc between a first electrode and a second electrode of the drill bit, the first electrode and the second electrode electrically coupled to the output capacitor;

discharging the output capacitor by the electrical arc;

fracturing a rock formation at an end of the wellbore with the electrical arc; and removing fractured rock from the end of the wellbore.

14. The method of claim 13, wherein the input stage tank circuit comprises a capacitor and an inductor configured to have approximately equal electrical reactance at the frequency.

15. The method of claim 13, wherein the series tank circuit comprises a capacitor, a first inductor, and a second inductor in series configured to have approximately equal electrical reactance at the frequency.

16. The method of claim 13, wherein the output stage tank circuit comprises a capacitor and an inductor in parallel configured to have approximately equal electrical reactance at the frequency.

17. The method of claim 13, wherein the input stage tank circuit, series tank circuit, and output stage tank circuit are electromagnetically coupled by a plurality of inductors configured to have a coupling coefficient between 0 and 0.3.

18. The method of claim 13, further comprising compressing a rise time of the electric pulse before the pulse is applied to the first electrode and the second electrode of the drill bit.

19. The method of claim 13, wherein the frequency is less than 100 MHz.

20. The method of claim 13, wherein the electric pulse from the pulse-generating circuit applies a voltage of approximately 150 kV across the first electrode and the second electrode.

21. The method of claim 13, wherein the drill bit is one of an electrocrushing drill bit and an electrohydraulic drill bit.

22. The method of claim 14, wherein the second electrode is a ground ring.

* * * * *